US012588425B2

(12) United States Patent
Parkin et al.

(10) Patent No.: US 12,588,425 B2
(45) Date of Patent: *Mar. 24, 2026

(54) SYSTEMS, ARTICLES, AND METHODS RELATED TO MULTILAYERED MAGNETIC MEMORY DEVICES

(71) Applicant: Samsung Electronics Co., Ltd., Suwon-si (KR)

(72) Inventors: Stuart Papworth Parkin, Halle (DE); See-Hun Yang, Halle (DE); Jiho Yoon, Halle (DE); Ung Hwan Pi, Hwaseong-si (KR)

(73) Assignees: Samsung Electronics Co., Ltd., Suwon-si (KR); Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 631 days.

This patent is subject to a terminal disclaimer.

(21) Appl. No.: 18/050,600

(22) Filed: Oct. 28, 2022

(65) Prior Publication Data

US 2023/0165164 A1 May 25, 2023

(30) Foreign Application Priority Data

Nov. 25, 2021 (KR) ........................ 10-2021-0164289

(51) Int. Cl.
*H10N 52/80* (2023.01)
*H10B 61/00* (2023.01)
*H10N 52/00* (2023.01)

(52) U.S. Cl.
CPC ............. *H10N 52/80* (2023.02); *H10B 61/00* (2023.02); *H10N 52/00* (2023.02)

(58) Field of Classification Search
CPC ........ H10N 52/80; H10N 52/00; H10N 50/80; H10N 50/10; H10N 50/85; H10B 61/00; (Continued)

(56) References Cited

U.S. PATENT DOCUMENTS 8,514,619 B2 8/2013 Hwang
8,951,811 B2 2/2015 Gaidis et al.
(Continued)

FOREIGN PATENT DOCUMENTS

KR 890008424 Y1 * 11/1989 ........... G11B 5/1278
KR 10-2021-0011535 A 2/2021
KR 10-2021-0021228 A 2/2021

OTHER PUBLICATIONS

Dao, et al., "Chiral Domain Wall Injector Driven by Spin—Orbit Torques", Nano Letters, 19(9), 2019, 5930-5937.
(Continued)

*Primary Examiner* — Duy T Nguyen
(74) *Attorney, Agent, or Firm* — Wolf, Greenfield & Sacks, P.C.

(57) ABSTRACT

A magnetic memory device includes a magnetic track extending in a first direction. The magnetic track includes a lower magnetic layer, an upper magnetic layer on the lower magnetic layer, a non-magnetic pattern on the lower magnetic layer and at a side of the upper magnetic layer, and a spacer layer between the lower magnetic layer and the upper magnetic layer and extending between the lower magnetic layer and the non-magnetic pattern. The lower magnetic layer and the upper magnetic layer are antiferromagnetically coupled to each other by the spacer layer. The non-magnetic pattern has a first surface and a second surface which are opposite to each other in a second direction perpendicular to the first direction. A junction surface between the non-magnetic pattern and the upper magnetic layer is inclined
(Continued)

with respect to a reference surface perpendicular to the first surface and the second surface.

20 Claims, 11 Drawing Sheets

(58) Field of Classification Search
CPC .............. G11C 11/161; G11C 11/1673; G11C 11/1675; G11C 19/0808; G11C 19/0841
USPC ........................................................ 257/421
See application file for complete search history.

(56) References Cited

U.S. PATENT DOCUMENTS

| | | | |
|---|---|---|---|
| 10,672,446 B2 | 6/2020 | Shibata et al. | |
| 10,693,058 B2 | 6/2020 | Lee | |
| 10,885,961 B2 | 1/2021 | Apalkov et al. | |
| 2005/0220990 A1* | 10/2005 | Aoyama | ................. C23C 14/48 |
| | | | 427/127 |
| 2011/0149649 A1* | 6/2011 | Hwang | ............... G11C 11/1673 |
| | | | 365/173 |
| 2016/0254046 A1* | 9/2016 | Ranjan | ................... H10B 61/00 |
| | | | 257/427 |
| 2020/0243752 A1 | 7/2020 | Sasaki | |
| 2020/0403147 A1 | 12/2020 | Couet et al. | |
| 2021/0028228 A1* | 1/2021 | Lee | ......................... H10N 50/80 |
| 2021/0050044 A1* | 2/2021 | Lee | ................... G11C 19/0833 |

OTHER PUBLICATIONS

Koyama, et al., "Observation of the intrinsic pinning of a magnetic domain wall in a ferromagnetic nanowire", Nature Materials, 10(3), 2011, 194-197.

Yoon et al., Local and global energy barriers for chiral domain walls in synthetic antiferromagnet-ferromagnet lateral junctions. Research Square, Jun. 15, 2021;Preprint(v1):1-23. [https://doi.org/10.21203/rs.3.rs-596109/v1].

* cited by examiner

FIG. 2

SYSTEMS, ARTICLES, AND METHODS RELATED TO MULTILAYERED MAGNETIC MEMORY DEVICES

CROSS-REFERENCE TO RELATED APPLICATIONS

This U.S. non-provisional patent application claims priority under 35 U.S.C. § 119 to Korean Patent Application No. 10-2021-0164289, filed on Nov. 25, 2021, in the Korean Intellectual Property Office, the entire contents of which are hereby incorporated by reference.

BACKGROUND OF THE INVENTION

The present disclosure relates to a magnetic memory device, and more particularly, to a magnetic memory device using a movement phenomenon of a magnetic domain wall.

Demand has increased for high-speed and low-voltage memory devices for use in high-speed and low-power electronic devices including memory devices. A magnetic memory device has been considered as a candidate memory device that may satisfy these demands. The magnetic memory device has been spotlighted as a next-generation memory device because of its high-speed operation characteristics and/or non-volatile characteristics. In particular, a new magnetic memory device using a movement phenomenon of a magnetic domain wall of a magnetic material has been researched and developed.

SUMMARY

Embodiments of the inventive concepts may provide a magnetic memory device configured to inject a magnetic domain wall into a magnetic track including a synthetic antiferromagnetic structure.

Embodiments of the inventive concepts may also provide a magnetic memory device configured to reduce a current density for injecting a magnetic domain wall into a magnetic track including a synthetic antiferromagnetic structure.

In an aspect, a magnetic memory device may include a magnetic track extending in a first direction. The magnetic track may include a lower magnetic layer, an upper magnetic layer on the lower magnetic layer, a non-magnetic pattern on the lower magnetic layer and at a side of the upper magnetic layer, and a spacer layer between the lower magnetic layer and the upper magnetic layer and extending between the lower magnetic layer and the non-magnetic pattern. The lower magnetic layer and the upper magnetic layer may be antiferromagnetically coupled to each other by the spacer layer. The non-magnetic pattern may have a first surface and a second surface which are opposite to each other in a second direction perpendicular to the first direction, and the first direction and the second direction may be parallel to a plane. A junction surface between the non-magnetic pattern and the upper magnetic layer may be inclined with respect to a reference surface perpendicular to the first surface and the second surface of the non-magnetic pattern.

In an aspect, a magnetic memory device may include a magnetic track extending in a first direction. The magnetic track may include a lower magnetic layer, an upper magnetic layer on the lower magnetic layer, a non-magnetic pattern on the lower magnetic layer and at a side of the upper magnetic layer, and a spacer layer between the lower magnetic layer and extending between the lower magnetic layer and the non-magnetic pattern. The lower magnetic layer and the upper magnetic layer may be antiferromagnetically coupled to each other by the spacer layer. The non-magnetic pattern may have a first surface and a second surface which are opposite to each other in a second direction perpendicular to the first direction, and the first direction and the second direction may be parallel to a plane. A length of the non-magnetic pattern in the first direction may become progressively greater from the first surface toward the second surface.

BRIEF DESCRIPTION OF THE DRAWINGS

FIG. 2 is a cross-sectional view illustrating a magnetic memory device according to some embodiments of the inventive concepts.

FIGS. 3A to 6A are plan views corresponding to a portion 'A' of FIG. 1 to illustrate a method of manufacturing a magnetic memory device according to some embodiments of the inventive concepts.

FIGS. 3B to 6B are cross-sectional views corresponding to a portion 'B' of FIG. 2 to illustrate a method of manufacturing a magnetic memory device according to some embodiments of the inventive concepts.

DETAILED DESCRIPTION

Figure 1:
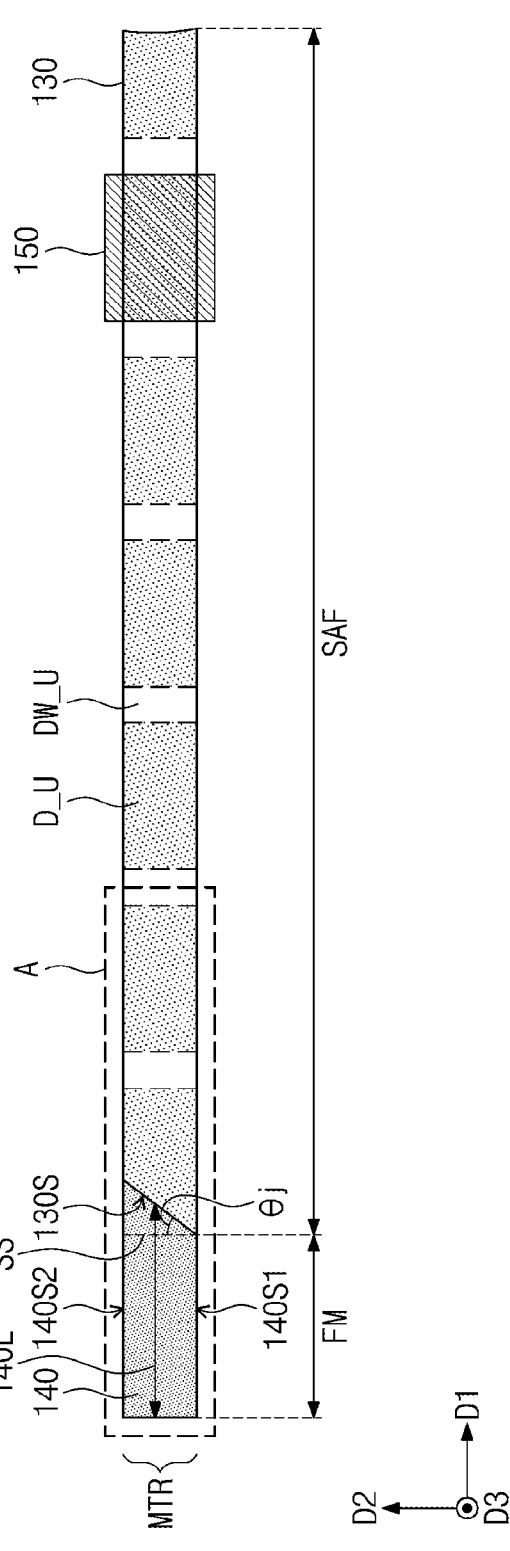
FIG. 1 is a plan view illustrating a magnetic memory device according to some embodiments of the inventive concepts.

Example embodiments of the inventive concepts will now be described more fully with reference to the accompanying drawings. The present disclosure may, however, be embodied in many different forms and should not be construed as limited to the embodiments set forth herein. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
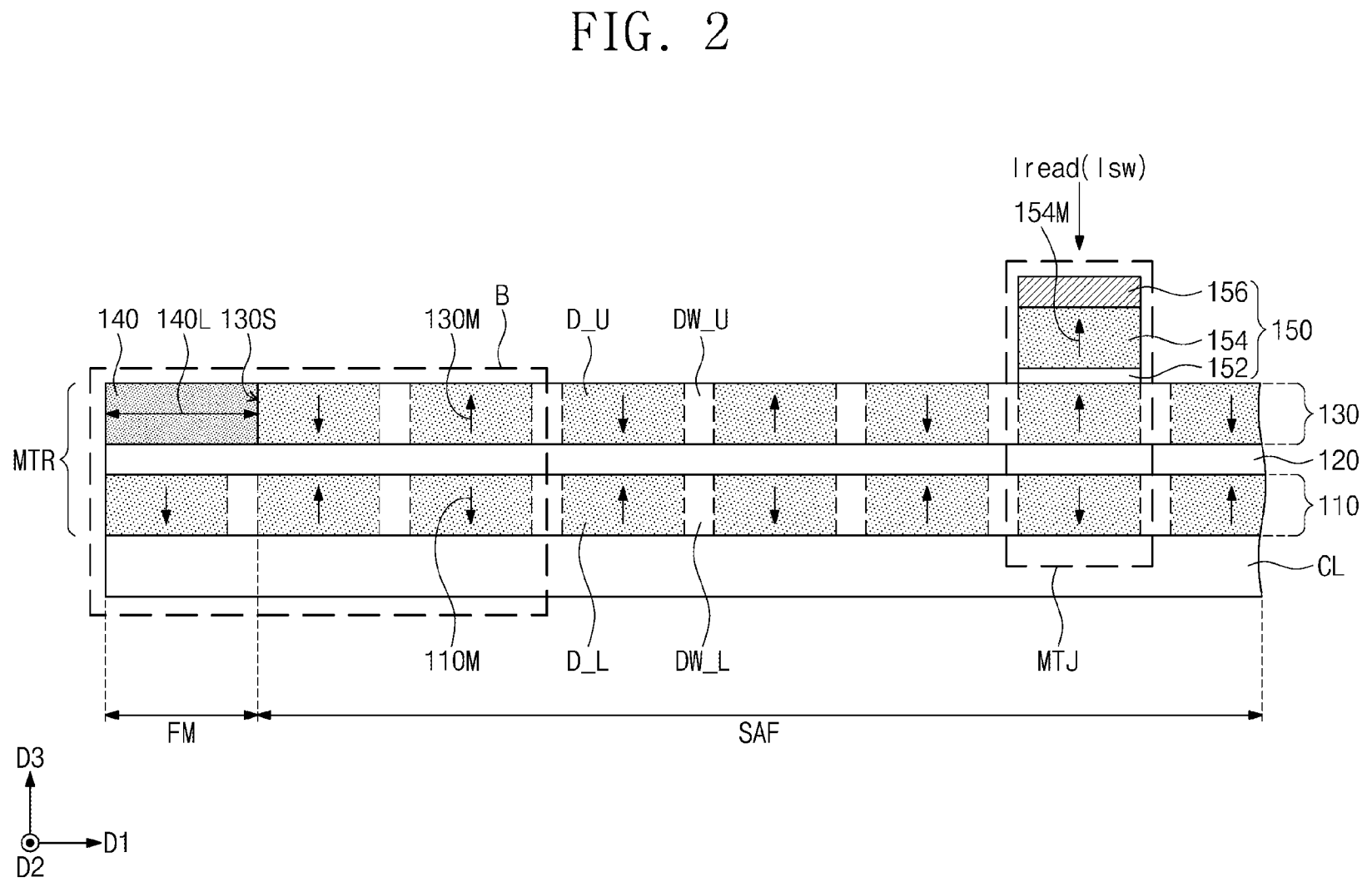

FIG. 1 is a plan view illustrating a magnetic memory device according to some embodiments of the inventive concepts. FIG. 2 is a cross-sectional view illustrating a magnetic memory device according to some embodiments of the inventive concepts.

Referring to FIGS. 1 and 2, a magnetic memory device may include a conductive line CL, a magnetic track MTR on the conductive line CL, and a read/write unit 150 on the magnetic track MTR. Each of the conductive line CL and the magnetic track MTR may have a line shape extending in a first direction D1. Each of the conductive line CL and the magnetic track MTR may have a line shape in which a length in the first direction D1 is greater than a width in a second direction D2 perpendicular to the first direction D1. The first direction D1 and the second direction D2 may be parallel to a plane (for example, a lower surface of the conductive line CL) and may be perpendicular to each other. In other words, a plane defined by the first direction D1 and the second direction D2 may be parallel to a lower surface of the conductive line CL. The magnetic track MTR may be stacked on the conductive line CL in a third direction D3 perpendicular to both the first direction D1 and the second direction D2. The third direction D3 may be perpendicular to the plane (for example, the lower surface of the conductive line CL or a plane defined by the first direction D1 and the second direction D2). The read/write unit 150 may be disposed adjacent to a portion of the magnetic track MTR.

The conductive line CL may be configured to generate spin-orbit torque by or in response to a current flowing therethrough. The conductive line CL may include a material configured to generate a spin hall effect or a Rashba effect by or in response to a current flowing in the first direction D1 or an opposite direction to the first direction D1 in the conductive line CL. The conductive line CL may include a heavy metal having an atomic number of 30 or more and may include, for example, iridium (Ir), ruthenium (Ru), tantalum (Ta), platinum (Pt), palladium (Pd), bismuth (Bi), titanium (Ti), and/or tungsten (W).

The magnetic track MTR may include a lower magnetic layer 110, a spacer layer 120 and an upper magnetic layer 130, which are sequentially stacked on the conductive line CL. The lower magnetic layer 110, the spacer layer 120 and the upper magnetic layer 130 may be sequentially stacked on the conductive line CL in the third direction D3. The lower magnetic layer 110 may be disposed between the conductive line CL and the spacer layer 120, and the spacer layer 120 may be disposed between the lower magnetic layer 110 and the upper magnetic layer 130. The lower magnetic layer 110, the spacer layer 120, and the upper magnetic layer 130 may have line shapes extending in the first direction D1. The conductive line CL and the magnetic track MTR may have straight line shapes extending in the first direction D1, but embodiments of the inventive concepts are not limited thereto. In some embodiments, the conductive line CL and the magnetic track MTR may have U-shaped line shapes.

The lower magnetic layer 110 may include lower magnetic domains D_L arranged in the first direction D1, and lower magnetic domain walls DW_L between the lower magnetic domains D_L. Each of the lower magnetic domains D_L may be a region in the lower magnetic layer 110 in which magnetic moments are aligned in a certain direction, and each of the lower magnetic domain walls DW_L may be a region in which directions of magnetic moments are changed between the lower magnetic domains D_L. The lower magnetic domains D_L and the lower magnetic domain walls DW_L may be alternately arranged in the first direction D1.

The upper magnetic layer 130 may include upper magnetic domains D_U arranged in the first direction D1, and upper magnetic domain walls DW_U between the upper magnetic domains D_U. Each of the upper magnetic domains D_U may be a region in the upper magnetic layer

130 in which magnetic moments are aligned in a certain direction, and each of the upper magnetic domain walls DW_U may be a region between the upper magnetic domains D_U. The upper magnetic domains D_U and the upper magnetic domain walls DW_U may be alternately arranged in the first direction D1. The upper magnetic domains D_U may vertically overlap with the lower magnetic domains D_L in the third direction D3, respectively.

The lower magnetic layer 110 and the upper magnetic layer 130 may be antiferromagnetically coupled to each other by the spacer layer 120. Each of the lower magnetic layer 110 and the upper magnetic layer 130 may include a magnetic element and may include at least one of, for example, cobalt (Co), iron (Fe), and/or nickel (Ni). The spacer layer 120 may include a non-magnetic metal and may include, for example, ruthenium (Ru), iridium (Ir), tungsten (W), tantalum (Ta), and/or any alloy thereof.

In some embodiments, the lower magnetic domains D_L in the lower magnetic layer 110 and the upper magnetic domains D_U in the upper magnetic layer 130 may have perpendicular magnetic anisotropy (PMA). Each of the lower magnetic domains D_L in the lower magnetic layer 110 may have a magnetization direction 110M substantially perpendicular to an interface between the lower magnetic layer 110 and the spacer layer 120, and the magnetization directions 110M of lower magnetic domains D_L adjacent directly to each other may be opposite to each other. Each of the lower magnetic domain walls DW_L may define a boundary between the adjacent lower magnetic domains D_L having the magnetization directions 110M opposite to each other. Each of the upper magnetic domains D_U in the upper magnetic layer 130 may have a magnetization direction 130M substantially perpendicular to an interface between the upper magnetic layer 130 and the spacer layer 120, and the magnetization directions 130M of upper magnetic domains D_U adjacent directly to each other may be opposite to each other. Each of the upper magnetic domain walls DW_U may define a boundary between the adjacent upper magnetic domains D_U having the magnetization directions 130M opposite to each other.

The upper magnetic domains D_U may vertically overlap with the lower magnetic domains D_L in the third direction D3, respectively, and the upper magnetic domains D_U and the lower magnetic domains D_L may be antiferromagnetically coupled to each other by the spacer layer 120. The magnetization direction 130M of each of the upper magnetic domains D_U may be antiparallel to the magnetization direction 110M of a corresponding lower magnetic domain D_L of the lower magnetic domains D_L.

The magnetic track MTR may further include a non-magnetic pattern 140 disposed on the spacer layer 120 and at a side of the upper magnetic layer 130. The non-magnetic pattern 140 may vertically overlap with a portion of the lower magnetic layer 110 in the third direction D3. For example, the non-magnetic pattern 140 may vertically overlap with a corresponding lower magnetic domain D_L of the lower magnetic domains D_L in the lower magnetic layer 110 (e.g., in the third direction D3). The corresponding lower magnetic domain D_L may have the magnetization direction 110M substantially perpendicular to the interface between the lower magnetic layer 110 and the spacer layer 120.

The spacer layer 120 may be disposed between the lower magnetic layer 110 and the upper magnetic layer 130 and may extend between the non-magnetic pattern 140 and the portion of the lower magnetic layer 110 (i.e., the portion that vertically overlaps in the third direction D3 with the non-magnetic pattern 140). The non-magnetic pattern 140 may include a metal oxide. The non-magnetic pattern 140 may include a same magnetic element as a magnetic element in the upper magnetic layer 130 and may further include oxygen.

The non-magnetic pattern 140 may be in contact with a side surface 130S of the upper magnetic layer 130. The side surface 130S of the upper magnetic layer 130 may be referred to as a junction surface 130S between the non-magnetic pattern 140 and the upper magnetic layer 130. The non-magnetic pattern 140 may have a first surface 140S1 and a second surface 140S2, which are opposite to each other in the second direction D2. The junction surface 130S between the non-magnetic pattern 140 and the upper magnetic layer 130 may be inclined with respect to a reference surface SS perpendicular to the first surface 140S1 and the second surface 140S2 of the non-magnetic pattern 140. The reference surface SS may be a surface perpendicular to the first direction D1 and parallel to a plane formed by the second direction D2 and the third direction D3. An angle θj between the junction surface 130S and the reference surface SS may be greater than 30 degrees. For example, the angle θj between the junction surface 130S and the reference surface SS may be greater than 30 degrees and less than 90 degrees. The non-magnetic pattern 140 may have a length 140L in the first direction D1. The length 140L of the non-magnetic pattern 140 in the first direction D1 may become progressively greater from the first surface 140S1 toward the second surface 140S2. In other words, a length in the first direction D1 of the second surface 140S2 of the non-magnetic pattern 140 may be greater than a length in the first direction D1 of the first surface 140S1 of the non-magnetic pattern 140.

The magnetic track MTR may include a synthetic antiferromagnetic region SAF and a ferromagnetic region FM. The synthetic antiferromagnetic region SAF may be a region in which the lower magnetic layer 110 and the upper magnetic layer 130 are antiferromagnetically coupled to each other by the spacer layer 120. The ferromagnetic region FM may include the non-magnetic pattern 140, and the portion (i.e., the corresponding lower magnetic domain D_L) of the lower magnetic layer 110, which vertically overlaps with the non-magnetic pattern 140. The magnetic track MTR may have a ferromagnet-synthetic antiferromagnet (FM-SAF) lateral junction structure in which the ferromagnetic region FM and the synthetic antiferromagnetic region SAF are joined to each other in the first direction D1. The junction surface 130S between the non-magnetic pattern 140 and the upper magnetic layer 130 may also be referred to as a junction surface 130S between the ferromagnetic region FM and the synthetic antiferromagnetic region SAF.

The ferromagnetic region FM of the magnetic track MTR may be a region used to inject a magnetic domain wall (e.g., the lower magnetic domain walls DW_L) into the synthetic antiferromagnetic region SAF of the magnetic track MTR for initialization of the magnetic memory device.

When a current flows in the first direction D1 or the opposite direction to the first direction D1 in the conductive line CL, the lower magnetic domain walls DW_L in the lower magnetic layer 110 may move in the first direction D1. The movement of the lower magnetic domain walls DW_L may be due to spin-orbit torque and Dzyaloshinskii-Moriya interaction (DMI) generated at an interface between the conductive line CL and the lower magnetic layer 110. A movement direction of the lower magnetic domain walls DW_L may be dependent on chirality of the lower magnetic domain walls DW_L. Since the lower magnetic domain walls DW_L in the lower magnetic layer 110 move in the first direction D1, the upper magnetic domain walls DW_U in the upper magnetic layer 130 may also move in the first direction D1. The movement of the upper magnetic domain walls DW_U may be due to the antiferromagnetic coupling between the lower magnetic layer 110 and the upper magnetic layer 130.

The read/write unit 150 may be disposed on the synthetic antiferromagnetic region SAF of the magnetic track MTR. The read/write unit 150 may include a GMR sensor using a giant magneto resistance effect or a TMR sensor using a tunnel magneto resistance effect. For example, the read/write unit 150 may include a magnetic pattern 154 on the upper magnetic layer 130, a tunnel barrier pattern 152 between the upper magnetic layer 130 and the magnetic pattern 154, and an electrode pattern 156 on the magnetic pattern 154. The magnetic pattern 154 may be disposed between the tunnel barrier pattern 152 and the electrode pattern 156. The magnetic pattern 154 may include at least one of cobalt (Co), iron (Fe), and/or nickel (Ni). The tunnel barrier pattern 152 may include at least one of magnesium (Mg) oxide, titanium (Ti) oxide, aluminum (Al) oxide, magnesium-zinc (Mg—Zn) oxide, and/or magnesium-boron (Mg—B) oxide. The electrode pattern 156 may include a conductive material and may include, for example, a metal (e.g., copper, tungsten, or aluminum) and/or a metal nitride (e.g., tantalum nitride, titanium nitride, and/or tungsten nitride).

The read/write unit 150 may vertically overlap with a corresponding upper magnetic domain D_U of the upper magnetic domains D_U in the upper magnetic layer 130 and a corresponding lower magnetic domain D_L of the lower magnetic domains D_L in the lower magnetic layer 110 (e.g., in the third direction D3).

In some embodiments, the magnetic pattern 154 of the read/write unit 150 may have perpendicular magnetic anisotropy (PMA). The magnetic pattern 154 may have a magnetization direction 154M substantially perpendicular to an interface between the magnetic pattern 154 and the tunnel barrier pattern 152, and the magnetization direction 154M of the magnetic pattern 154 may be fixed in one direction. The magnetization directions 130M of the upper magnetic domains D_U in the upper magnetic layer 130 and the magnetization directions 110M of the lower magnetic domains D_L in the lower magnetic layer 110 may be changeable to be parallel or antiparallel to the magnetization direction 154M of the magnetic pattern 154.

The magnetic pattern 154 may vertically overlap with a corresponding upper magnetic domain D_U of the upper magnetic domains D_U and a corresponding lower magnetic domain D_L of the lower magnetic domains D_L (e.g., in the third direction D3). The magnetic pattern 154, the corresponding upper magnetic domain D_U and the corresponding lower magnetic domain D_L, which vertically overlap with each other, may constitute a magnetic tunnel junction MTJ. The magnetic pattern 154 may be a pinned layer having the magnetization direction 154M fixed in one direction, and the corresponding upper magnetic domain D_U and the corresponding lower magnetic domain D_L may be antiferromagnetically coupled to each other to constitute a free layer having a synthetic antiferromagnetic structure.

In a read operation, a read current Tread may flow through the magnetic tunnel junction MTJ. A resistance state of the magnetic tunnel junction MTJ may be detected by the read current Tread. Whether the magnetic tunnel junction MTJ is in a high-resistance state or a low-resistance state may be detected by the read current Tread. Data (0 or 1) stored in the free layer may be detected from the resistance state of the magnetic tunnel junction MTJ. In a write operation, a write current Isw may flow through the magnetic tunnel junction MTJ. A magnitude of the write current Isw may be greater than a magnitude of the read current Tread. The magnetization direction 130M of the corresponding upper magnetic domain D_U may be switched by spin transfer torque generated by the write current Isw. The magnetization direction 130M of the corresponding upper magnetic domain D_U may be switched to be parallel or antiparallel to the magnetization direction 154M of the magnetic pattern 154, by the spin transfer torque generated by the write current Isw. The magnetization direction 110M of the corresponding lower magnetic domain D_L may be switched to be antiparallel to the magnetization direction 130M of the corresponding upper magnetic domain D_U, by the antiferromagnetic coupling between the corresponding upper magnetic domain D_U and the corresponding lower magnetic domain D_L.

In some embodiments, each of the lower magnetic layer 110, the upper magnetic layer 130, and the magnetic pattern 154 may include at least one of cobalt (Co), iron (Fe), and/or nickel (Ni) and may further include one or more non-magnetic materials, such as boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). For example, each of the lower magnetic layer 110, the upper magnetic layer 130 and the magnetic pattern 154 may include at least one of a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where 'n' denotes the number of bilayers. In certain embodiments, each of the lower magnetic layer 110, the upper magnetic layer 130 and the magnetic pattern 154 may include CoFeB and/or a Co-based Heusler alloy.

FIGS. 3A to 6A are plan views corresponding to a portion 'A' of FIG. 1 to illustrate a method of manufacturing a magnetic memory device according to some embodiments of the inventive concepts. FIGS. 3B to 6B are cross-sectional views corresponding to a portion 'B' of FIG. 2 to illustrate a method of manufacturing a magnetic memory device according to some embodiments of the inventive concepts. Hereinafter, the descriptions of the same features as mentioned with reference to FIGS. 1 and 2 will be omitted for the purpose of ease and convenience in explanation.

Figure 3A:
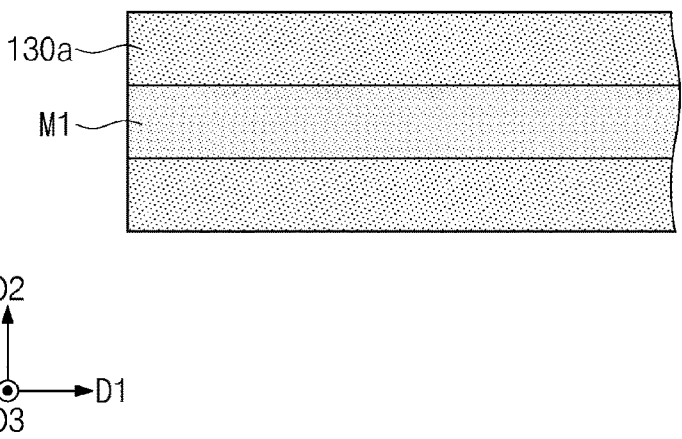
Figure 3B:
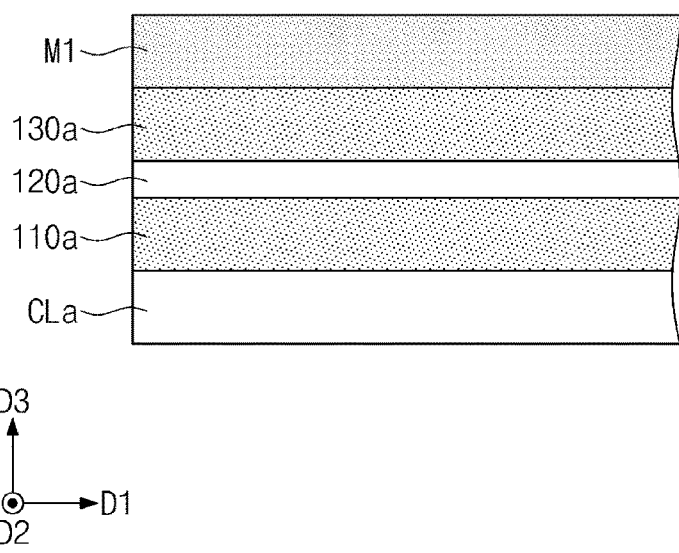

Referring to FIGS. 3A and 3B, a first magnetic layer 110a, a non-magnetic layer 120a, and a second magnetic layer 130a may be sequentially stacked on a conductive layer CLa. The conductive layer CLa, the first magnetic layer 110a, the non-magnetic layer 120a, and the second magnetic layer 130a may be formed using a chemical vapor deposition (CVD) method and/or a physical vapor deposition (PVD) method and may be formed using, for example, a sputtering deposition method. A first mask pattern M1 may be formed on the second magnetic layer 130a. The first mask pattern M1 may have a line shape extending in the first direction D1 and may be a photoresist pattern or a hard mask pattern.

Figure 4A:
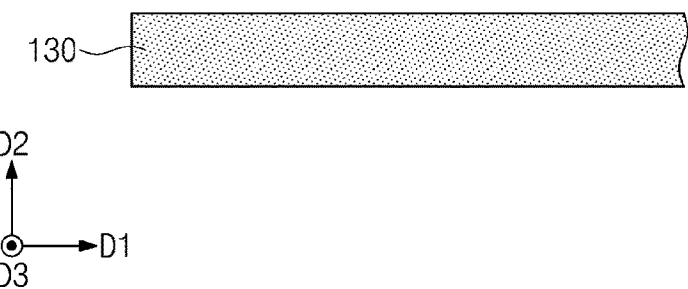
Figure 4B:
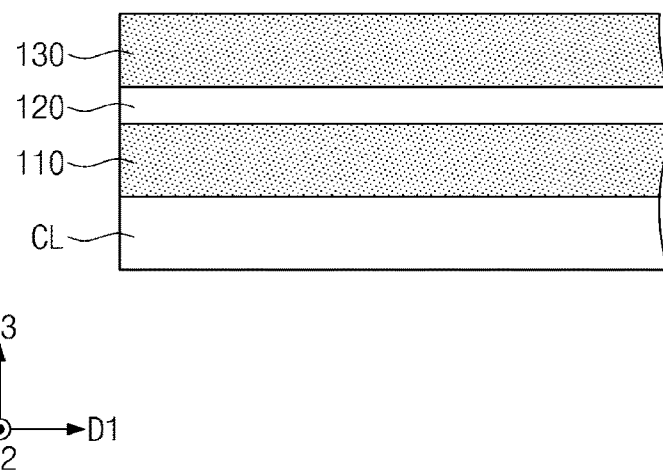

Referring to FIGS. 4A and 4B, the second magnetic layer 130a, the non-magnetic layer 120a, the first magnetic layer 110a, and the conductive layer CLa may be sequentially etched using the first mask pattern M1 as an etch mask. The second magnetic layer 130a, the non-magnetic layer 120a, the first magnetic layer 110a and the conductive layer CLa may be sequentially etched by, for example, an ion beam etching process. An upper magnetic layer 130, a spacer layer 120, a lower magnetic layer 110 and a conductive line CL may be formed by etching the second magnetic layer 130a, the non-magnetic layer 120a, the first magnetic layer 110a and the conductive layer CLa, respectively. The lower magnetic layer 110 and the upper magnetic layer 130 may be antiferromagnetically coupled to each other by the spacer layer 120.

After the formation of the conductive line CL, the lower magnetic layer 110, the spacer layer 120, and the upper magnetic layer 130, the first mask pattern M1 may be removed. The first mask pattern M1 may be removed by, for example, an ashing process and/or a strip process.

Figure 5A:
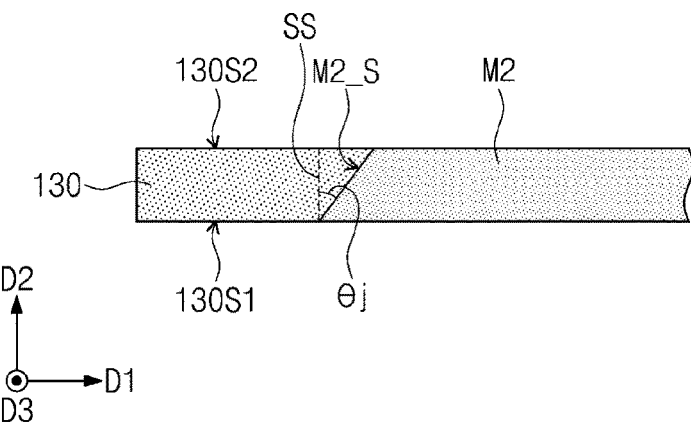
Figure 5B:
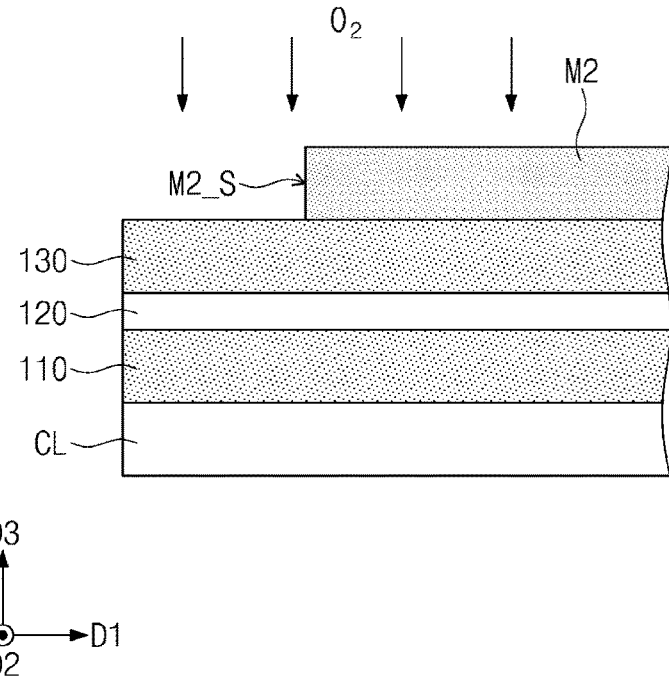

Referring to FIGS. 5A and 5B, a second mask pattern M2 may be formed on the upper magnetic layer 130. The second mask pattern M2 may expose a portion of the upper magnetic layer 130 and may at least partially cover a remaining portion of the upper magnetic layer 130. The second mask pattern M2 may be formed to have a line shape extending in the first direction D1, but embodiments of the inventive concepts are not limited thereto. The second mask pattern M2 may be a photoresist pattern or a hard mask pattern. The second mask pattern M2 may include a metal nitride and may include, for example, TaN.

A side surface M2_S of the second mask pattern M2 may be adjacent to the exposed portion of the upper magnetic layer 130. The upper magnetic layer 130 may have a first surface 130S1 and a second surface 130S2, which are opposite to each other in the second direction D2. The side surface M2_S of the second mask pattern M2 may be inclined with respect to a reference surface SS perpendicular to the first surface 130S1 and the second surface 130S2 of the upper magnetic layer 130 and parallel to a plane formed by the second direction D2 and the third direction D3. An angle θj between the side surface M2_S of the second mask pattern M2 and the reference surface SS may be greater than 30 degrees. For example, the angle θj between the side surface M2_S of the second mask pattern M2 and the reference surface SS may be greater than 30 degrees and less than 90 degrees.

An oxidation process may be performed on the upper magnetic layer 130. The second mask pattern M2 may be used as a mask of the oxidation process. The oxidation process may include, for example, an oxygen plasma treatment.

Figure 6A:
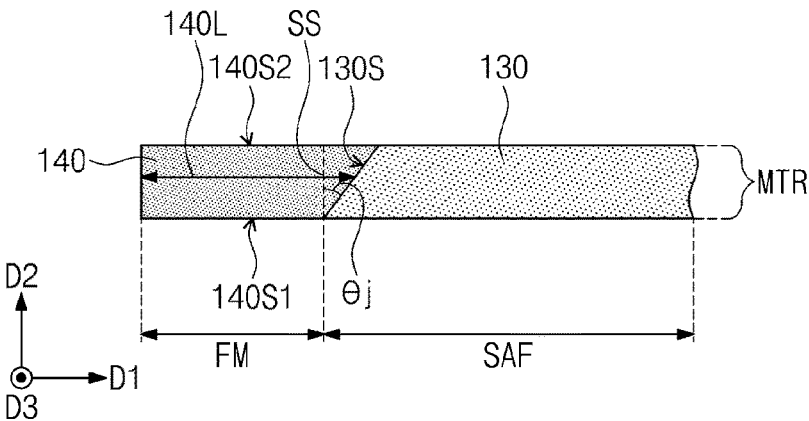
Figure 6B:
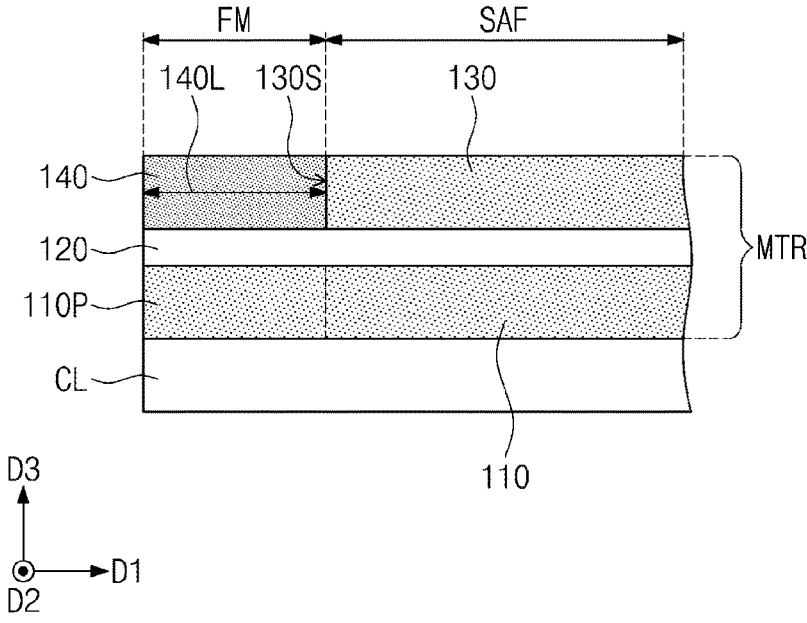

Referring to FIGS. 6A and 6B, the exposed portion of the upper magnetic layer 130 may be oxidized by the oxidation process, and thus a non-magnetic pattern 140 may be formed at a side of the upper magnetic layer 130. The non-magnetic pattern 140 may include a metal oxide. The non-magnetic pattern 140 may include the same magnetic element as the upper magnetic layer 130 and may further include oxygen.

The non-magnetic pattern 140 may be in contact with a side surface 130S of the upper magnetic layer 130. The side surface 130S of the upper magnetic layer 130 may be referred to as a junction surface 130S between the non-magnetic pattern 140 and the upper magnetic layer 130. The non-magnetic pattern 140 may have a first surface 140S1 and a second surface 140S2, which are opposite to each other in the second direction D2. The junction surface 130S between the non-magnetic pattern 140 and the upper magnetic layer 130 may be inclined with respect to the reference surface SS perpendicular to the first surface 140S1 and the second surface 140S2 of the non-magnetic pattern 140 and parallel to a plane formed by the second direction D2 and the third direction D3. An angle θj between the junction surface 130S and the reference surface SS may be greater than 30 degrees. For example, the angle θj between the junction surface 130S and the reference surface SS may be greater than 30 degrees and less than 90 degrees. The non-magnetic pattern 140 may have a length 140L in the first direction D1. The length 140L of the non-magnetic pattern 140 in the first direction D1 may become progressively greater from the first surface 140S1 toward the second surface 140S2. In other words, a length in the first direction D1 of the second surface 140S2 of the non-magnetic pattern 140 may be greater than a length in the first direction D1 of the first surface 140S1 of the non-magnetic pattern 140.

The spacer layer 120 may be used as an oxidation stop layer of the oxidation process. Thus, a portion 110P of the lower magnetic layer 110, which vertically overlaps with the non-magnetic pattern 140 (e.g., in the third direction D3), may not be oxidized by the oxidation process, but may maintain a ferromagnetic property.

After the formation of the non-magnetic pattern 140 by the oxidation process, the second mask pattern M2 may be removed. The second mask pattern M2 may be removed by, for example, an ashing process and/or a strip process.

The lower magnetic layer 110, the spacer layer 120, the upper magnetic layer 130, and the non-magnetic pattern 140 may constitute a magnetic track MTR. The conductive line CL and the magnetic track MTR may have line shapes extending in the first direction D1.

The magnetic track MTR may include a synthetic antiferromagnetic region SAF and a ferromagnetic region FM. The synthetic antiferromagnetic region SAF may be a region in which the lower magnetic layer 110 and the upper magnetic layer 130 are antiferromagnetically coupled to each other by the spacer layer 120. The ferromagnetic region FM may include the non-magnetic pattern 140, and the portion 110P of the lower magnetic layer 110 which vertically (i.e., D3 direction) overlaps with the non-magnetic pattern 140. The magnetic track MTR may have a ferromagnet-synthetic antiferromagnet (FM-SAF) lateral junction structure in which the ferromagnetic region FM and the synthetic antiferromagnetic region SAF are joined to each other in the first direction D1. The junction surface 130S between the non-magnetic pattern 140 and the upper magnetic layer 130 may also be referred to as a junction surface 130S between the ferromagnetic region FM and the synthetic antiferromagnetic region SAF.

Referring again to FIGS. 1 and 2, a read/write unit 150 may be formed on the synthetic antiferromagnetic region SAF of the magnetic track MTR. For example, the formation of the read/write unit 150 may include sequentially forming a tunnel insulating layer, a magnetic layer, and an electrode layer on the magnetic track MTR, and etching the tunnel insulating layer, the magnetic layer and the electrode layer. A tunnel barrier pattern 152, a magnetic pattern 154 and an electrode pattern 156 may be formed by etching the tunnel insulating layer, the magnetic layer, and the electrode layer, respectively.

FIGS. 7A to 7D are cross-sectional views corresponding to the portion 'B' of FIG. 2 to illustrate a method for initializing a magnetic memory device according to some embodiments of the inventive concepts. Hereinafter, the descriptions of the same features as mentioned with reference to FIGS. 1 and 2 will be omitted for the purpose of ease and convenience in explanation.

Figure 7A:
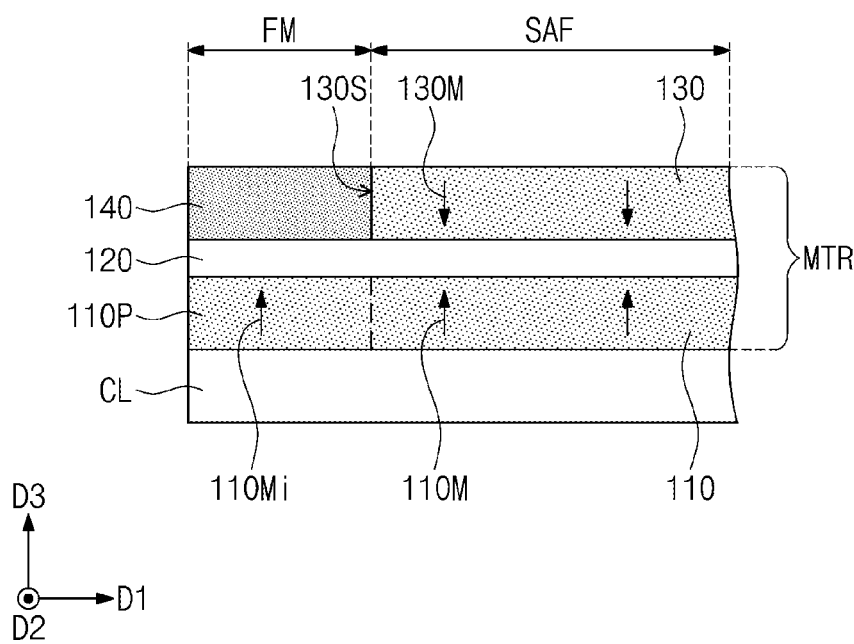
FIGS. 7A to 7D are cross-sectional views corresponding to the portion 'B' of FIG. 2 to illustrate a method for initializing a magnetic memory device according to some embodiments of the inventive concepts.

Referring to FIG. 7A, a magnetic memory device may include a conductive line CL and a magnetic track MTR on the conductive line CL. The magnetic track MTR may include a lower magnetic layer 110, a spacer layer 120 and an upper magnetic layer 130 which are sequentially stacked on the conductive line CL and may further include a non-magnetic pattern 140 disposed on the spacer layer 120 and at a side of the upper magnetic layer 130. The non-magnetic pattern 140 may vertically overlap with a portion 110P of the lower magnetic layer 110 in the third direction D3. The magnetic track MTR may include a synthetic antiferromagnetic region SAF in which the lower magnetic layer 110 and the upper magnetic layer 130 are antiferromagnetically coupled to each other by the spacer layer 120, and a ferromagnetic region FM including the non-magnetic pattern 140 and the portion 110P of the lower magnetic layer 110, which vertically overlap with each other (e.g., in the third direction D3). A junction surface 130S between the ferromagnetic region FM and the synthetic antiferromagnetic region SAF (i.e., a junction surface between the non-magnetic pattern 140 and the upper magnetic layer 130) may be inclined with respect to the reference surface SS perpendicular to the first surface 140S1 and the second surface 140S2 of the non-magnetic pattern 140, as described with reference to FIGS. 1 and 2.

In some embodiments, the lower magnetic layer 110 may have a magnetization direction 110M substantially perpendicular to an interface between the lower magnetic layer 110 and the spacer layer 120, and the upper magnetic layer 130 may have a magnetization direction 130M substantially perpendicular to an interface between the upper magnetic layer 130 and the spacer layer 120. The lower magnetic layer 110 and the upper magnetic layer 130 may be antiferromagnetically coupled to each other by the spacer layer 120, and thus the magnetization direction 130M of the upper magnetic layer 130 may be antiparallel to the magnetization direction 110M of the lower magnetic layer 110. For example, the magnetization direction 110M of the lower magnetic layer 110 may be aligned in an up-direction, and the magnetization direction 130M of the upper magnetic layer 130 may be aligned in a down-direction.

An initial magnetization direction 110Mi of the portion 110P of the lower magnetic layer 110, which vertically overlaps with the non-magnetic pattern 140 may be the same as the magnetization direction 110M of the lower magnetic layer 110. For example, the initial magnetization direction 110Mi of the portion 110P of the lower magnetic layer 110 may be aligned in the up-direction.

Figure 7B:
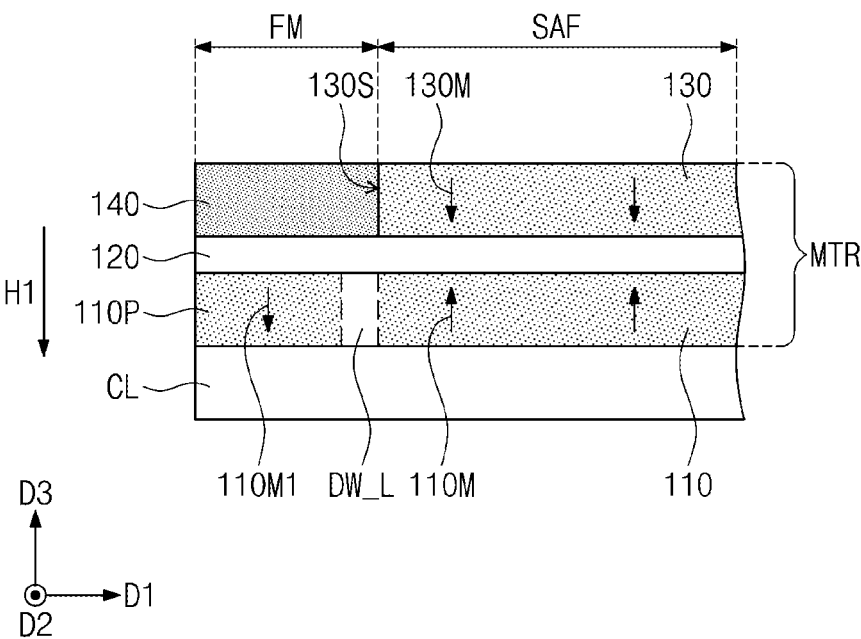

Referring to FIG. 7B, an external magnetic field H1 may be applied to the magnetic track MTR. A direction of the external magnetic field H1 may be an opposite direction to the initial magnetization direction 110Mi of the portion 110P of the lower magnetic layer 110. For example, the direction of the external magnetic field H1 may be the down-direction.

A coercivity (Hc) of the synthetic antiferromagnetic region SAF of the magnetic track MTR may be greater than a coercivity (Hc) of the ferromagnetic region FM of the magnetic track MTR. Since the synthetic antiferromagnetic region SAF of the magnetic track MTR has a relatively greater coercivity (Hc), the magnetization directions 110M and 130M of the lower magnetic layer 110 and the upper magnetic layer 130 in the synthetic antiferromagnetic region SAF of the magnetic track MTR may not be reversed by the external magnetic field H1. Since the ferromagnetic region FM of the magnetic track MTR has a relatively lower coercivity (Hc), the initial magnetization direction 110Mi of the portion 110P of the lower magnetic layer 110 in the ferromagnetic region FM of the magnetic track MTR may be reversed by the external magnetic field H1. Thus, the portion 110P of the lower magnetic layer 110 may have a first magnetization direction 110M1 aligned in the down-direction.

Since the initial magnetization direction 110Mi of the portion 110P of the lower magnetic layer 110 is reversed to the first magnetization direction 110M1 by the external magnetic field H1, a lower magnetic domain wall DW_L may be formed in the portion 110P of the lower magnetic layer 110, which is adjacent to the junction between the ferromagnetic region FM and the synthetic antiferromagnetic region SAF.

Figure 7C:
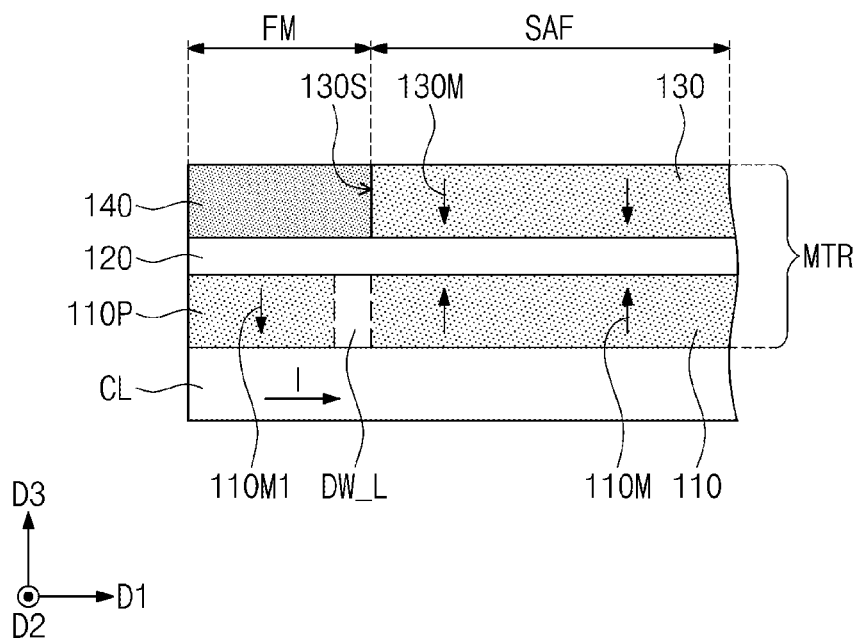

Referring to FIG. 7C, a current I may be applied to flow in the conductive line CL in the first direction D1 (or the opposite direction to the first direction D1). Thus, the lower magnetic domain wall DW_L formed in the portion 110P of the lower magnetic layer 110 in the ferromagnetic region FM may be injected into the lower magnetic layer 110 in the synthetic antiferromagnetic region SAF. For example, the lower magnetic domain wall DW_L may move in the first direction D1.

To inject the lower magnetic domain wall DW_L from the ferromagnetic region FM into the synthetic antiferromagnetic region SAF, a relatively greater current density may be required in the conductive line CL.

According to the inventive concepts, as described with reference to FIGS. 1 and 2, the junction surface 130S between the ferromagnetic region FM and the synthetic antiferromagnetic region SAF (i.e., the junction surface between the non-magnetic pattern 140 and the upper magnetic layer 130) may be inclined with respect to the reference surface SS perpendicular to the first surface 140S1 and the second surface 140S2 of the non-magnetic pattern 140, and the angle θj between the junction surface 130S and the reference surface SS may be greater than 30 degrees. Thus, it may be possible to reduce the current density applied to the conductive line CL to inject the lower magnetic domain wall DW_L from the ferromagnetic region FM into the synthetic antiferromagnetic region SAF. In other words, it may be possible to reduce the current density for injecting a magnetic domain wall (e.g., the lower magnetic domain wall DW_L) into the magnetic track MTR including the synthetic antiferromagnetic region SAF. As a result, it may be possible to provide the magnetic memory device configured to inject the magnetic domain wall (e.g., the lower magnetic domain wall DW_L) into the magnetic track MTR including the synthetic antiferromagnetic region SAF.

Figure 7D:
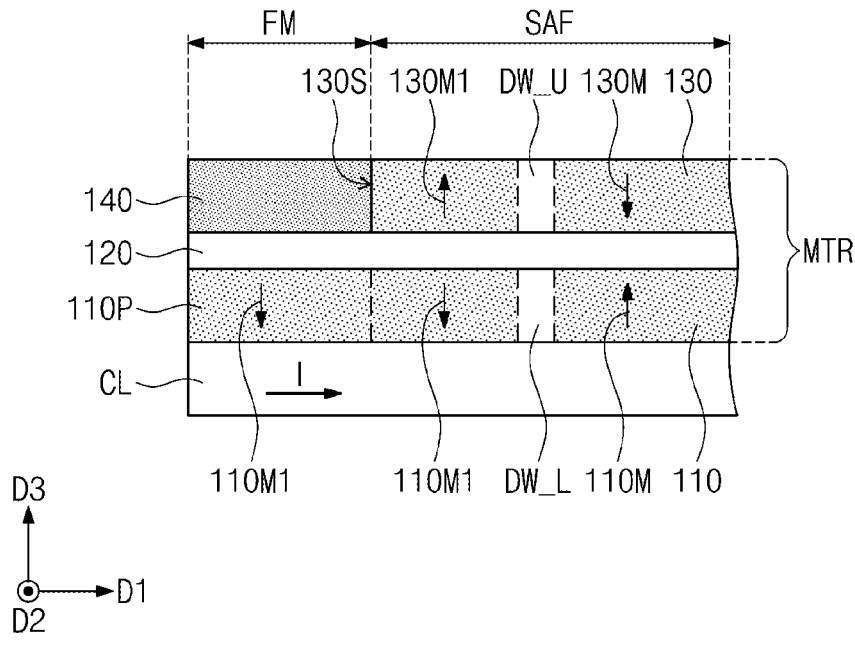

Referring to FIG. 7D, by or in response to the current I applied to the conductive line CL, the lower magnetic domain wall DW_L may be injected into the lower magnetic layer 110 in the synthetic antiferromagnetic region SAF and may move in the lower magnetic layer 110 in the synthetic antiferromagnetic region SAF in the first direction D1. With the movement of the lower magnetic domain wall DW_L, the magnetization direction 110M of the lower magnetic layer 110 may be reversed to the first magnetization direction 110M1 aligned in the down-direction.

By the antiferromagnetic coupling between the upper magnetic layer 130 and the lower magnetic layer 110, the magnetization direction 130M of the upper magnetic layer 130 may be reversed to be antiferromagnetically coupled to the first magnetization direction 110M1 of the lower magnetic layer 110. A reversed magnetization direction 130M1 of the upper magnetic layer 130 may be antiferromagnetically coupled to the first magnetization direction 110M1 of the lower magnetic layer 110 and may be aligned in, for example, the up-direction. Since the upper magnetic layer 130 has the reversed magnetization direction 130M1, an upper magnetic domain wall DW_U may be formed in the upper magnetic layer 130. The upper magnetic domain wall DW_U may vertically overlap with the lower magnetic domain wall DW_L (e.g., in the third direction D3).

Figure 8:
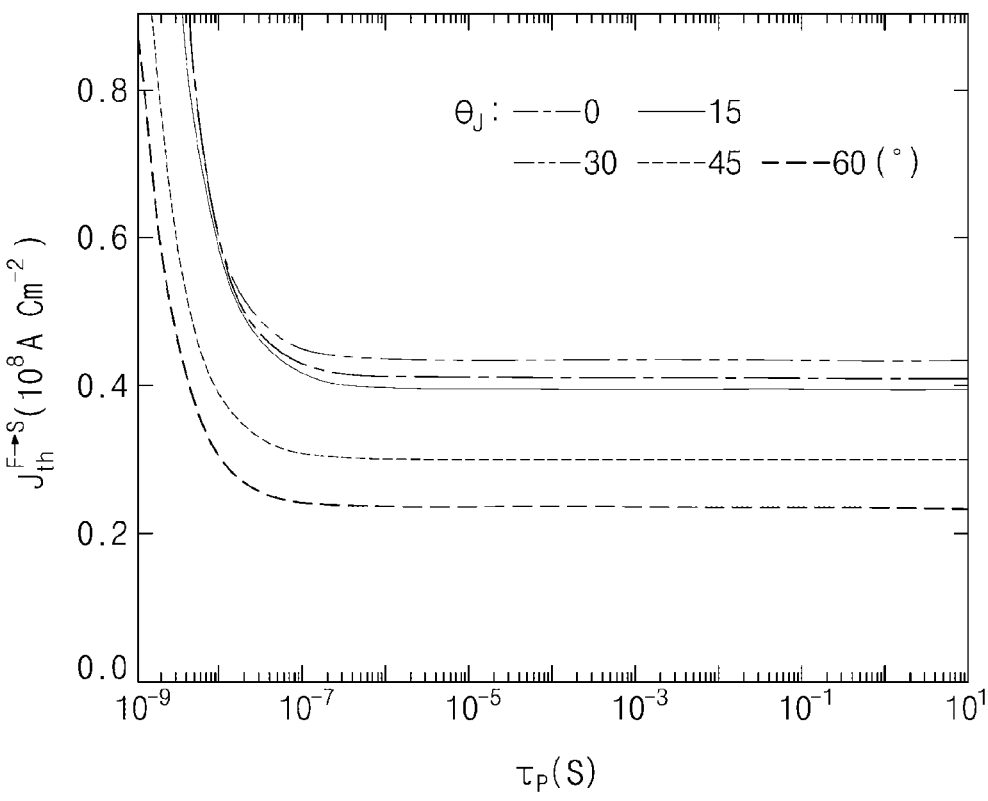
FIGS. 8 and 9 are graphs showing a current density for injecting a magnetic domain wall into a magnetic track of a magnetic memory device according to some embodiments of the inventive concepts.
Figure 9:
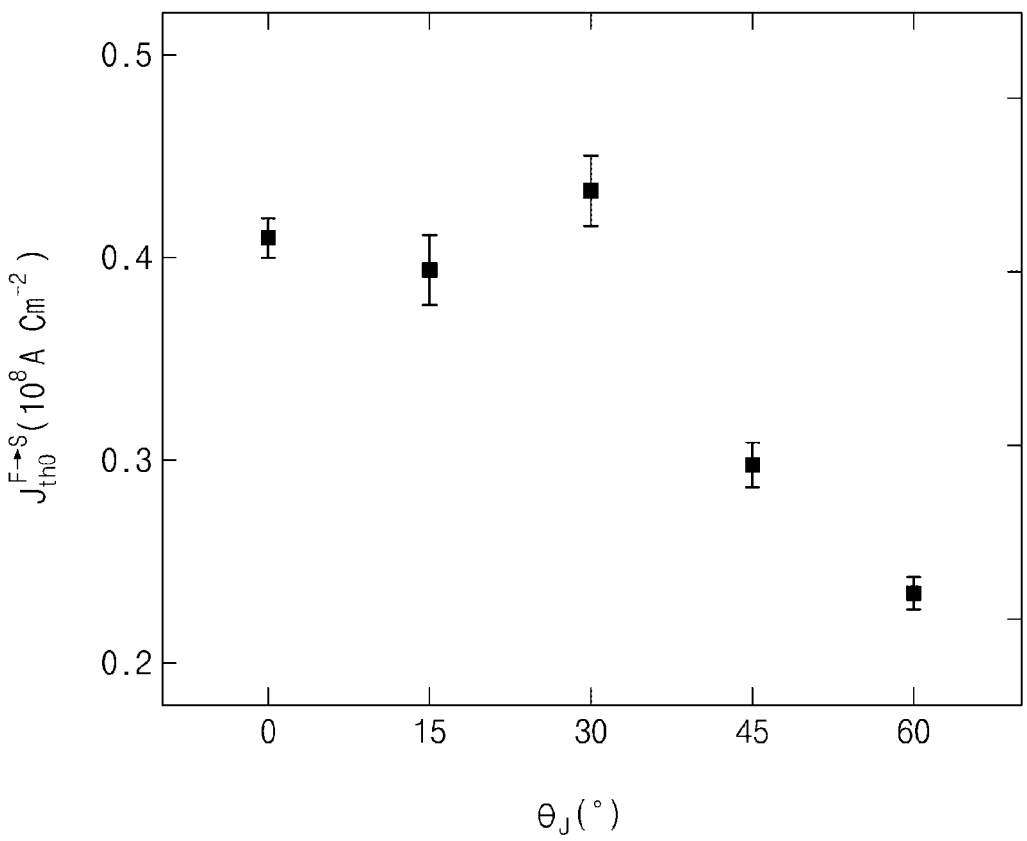

FIGS. 8 and 9 are graphs showing a current density for injecting a magnetic domain wall into a magnetic track of a magnetic memory device according to some embodiments of the inventive concepts.

FIG. 8 shows a current density J according to a pulse width $\tau_p$ of the current I applied to the conductive line CL to inject the lower magnetic domain wall DW_L from the ferromagnetic region FM of the magnetic track MTR into the synthetic antiferromagnetic region SAF of the magnetic track MTR. It may be recognized that the current density J is reduced under a condition of the same pulse width $\tau_p$ of the current I when the angle θj between the reference surface SS and the junction surface 130S between the ferromagnetic region FM and the synthetic antiferromagnetic region SAF is greater than 30 degrees (e.g., θj=45° or θj=60°.

FIG. 9 shows a current density J applied to the conductive line CL to inject the lower magnetic domain wall DW_L from the ferromagnetic region FM into the synthetic antiferromagnetic region SAF, according to the angle θj between the reference surface SS and the junction surface 130S between the ferromagnetic region FM and the synthetic antiferromagnetic region SAF. It may be recognized that the current density J applied to the conductive line CL is reduced when the angle θj between the reference surface SS and the junction surface 130S between the ferromagnetic region FM and the synthetic antiferromagnetic region SAF is greater than 30 degrees (e.g., θj=45° or θj=60°.

Figure 10:
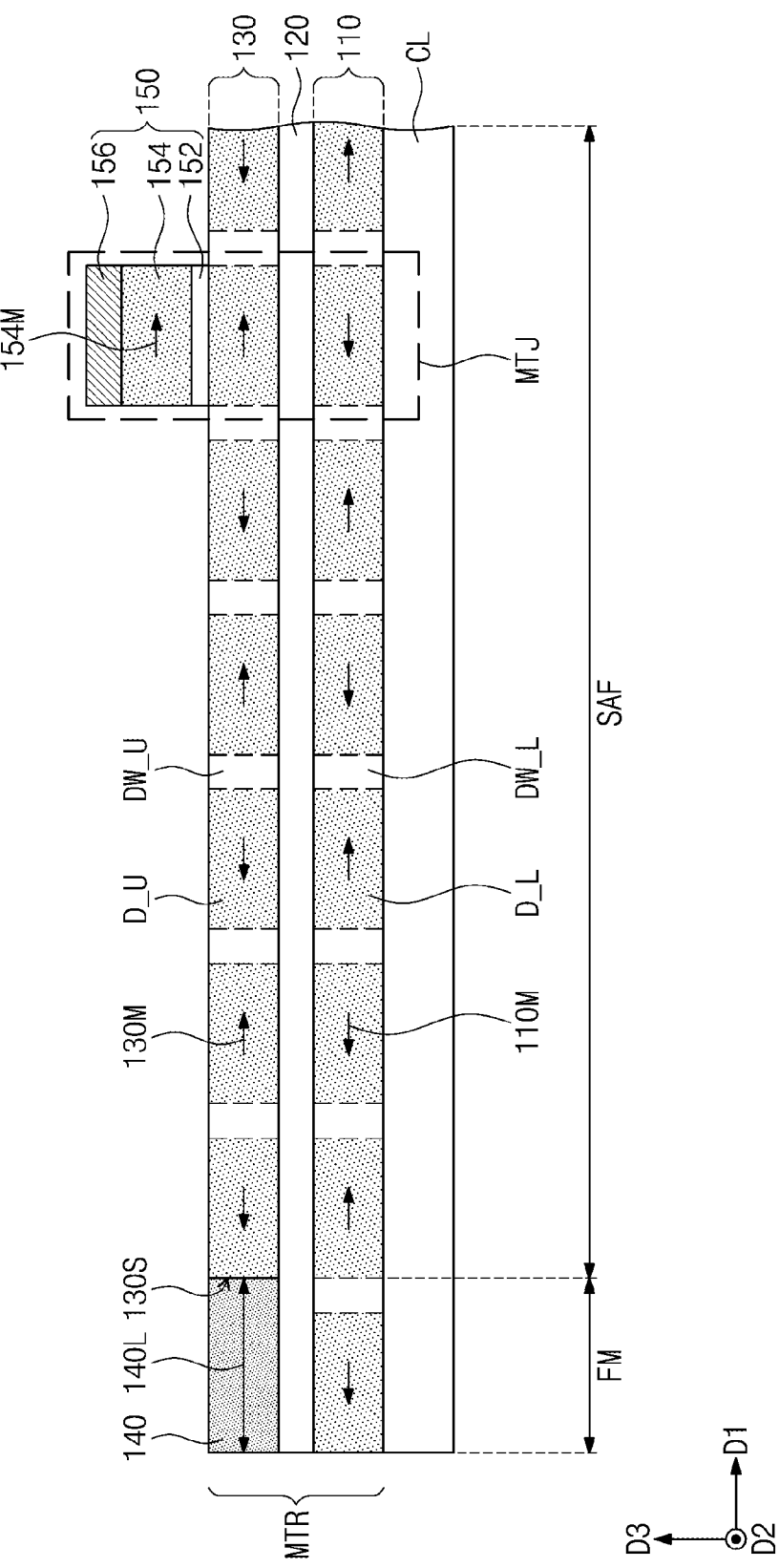
FIG. 10 is a cross-sectional view illustrating a magnetic memory device according to some embodiments of the inventive concepts.

FIG. 10 is a cross-sectional view illustrating a magnetic memory device according to some embodiments of the inventive concepts. Hereinafter, differences between the present embodiments and the above embodiments of FIGS. 1 and 2 will be mainly described for the purpose of ease and convenience in explanation.

Referring to FIGS. 1 and 10, the lower magnetic domains D_L in the lower magnetic layer 110 and the upper magnetic domains D_U in the upper magnetic layer 130 may have in-plane magnetic anisotropy (IMA). Each of the lower magnetic domains D_L in the lower magnetic layer 110 may have a magnetization direction 110M parallel to an interface between the lower magnetic layer 110 and the spacer layer 120, and magnetization directions 110M of lower magnetic domains D_L adjacent directly to each other may be opposite to each other. Each of the lower magnetic domain walls DW_L may define a boundary between the adjacent lower magnetic domains D_L having the magnetization directions 110M opposite to each other. Each of the upper magnetic domains D_U in the upper magnetic layer 130 may have a magnetization direction 130M parallel to an interface between the upper magnetic layer 130 and the spacer layer 120, and magnetization directions 130M of upper magnetic domains D_U adjacent directly to each other may be opposite to each other. Each of the upper magnetic domain walls DW_U may define a boundary between the adjacent upper magnetic domains D_U having the magnetization directions 130M opposite to each other.

The magnetic pattern 154 of the read/write unit 150 may have in-plane magnetic anisotropy (IMA). The magnetic pattern 154 may have a magnetization direction 154M parallel to an interface between the magnetic pattern 154 and the tunnel barrier pattern 152, and the magnetization direction 154M of the magnetic pattern 154 may be fixed in one direction. The magnetization directions 130M of the upper magnetic domains D_U in the upper magnetic layer 130 and the magnetization directions 110M of the lower magnetic domains D_L in the lower magnetic layer 110 may be changeable to be parallel or antiparallel to the magnetization direction 154M of the magnetic pattern 154.

In some embodiments, each of the lower magnetic layer 110, the upper magnetic layer 130 and the magnetic pattern 154 may include a ferromagnetic material, and the magnetic pattern 154 may further include an antiferromagnetic material for pinning or fixing a magnetization direction of the ferromagnetic material.

Except for the aforementioned differences, other features and components of the magnetic memory device according to the present embodiments may be substantially the same as corresponding features and components of the magnetic memory device described with reference to FIGS. 1 and 2. In addition, the magnetic memory device according to the present embodiments may be formed by substantially the same method as described with reference to FIGS. 3A to 6A and 3B to 6B and may be initialized by substantially the same method as described with reference to FIGS. 7A to 7D.

According to the inventive concepts, the magnetic memory device may include the conductive line and the magnetic track on the conductive line, and the conductive line and the magnetic track may extend in the first direction. The magnetic track may have the ferromagnet-synthetic antiferromagnet (FM-SAF) lateral junction structure in which the ferromagnetic region and the synthetic antiferromagnetic region are joined to each other in the first direction. The junction surface between the ferromagnetic region and the synthetic antiferromagnetic region may be inclined with respect to the reference surface perpendicular to the first direction, and the angle between the junction surface and the reference surface may be greater than 30 degrees. Thus, it may be possible to reduce a current density applied to the conductive line to inject a magnetic domain wall from the ferromagnetic region into the synthetic antiferromagnetic region. In other words, it may be possible to reduce the current density for injecting the magnetic domain wall into the magnetic track including the synthetic antiferromagnetic region. As a result, it may be possible to provide a magnetic memory device configured to inject a magnetic domain wall into the magnetic track including the synthetic antiferromagnetic region.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device comprising:
a magnetic track extending in a first direction,
wherein the magnetic track comprises:
a lower magnetic layer;
an upper magnetic layer on the lower magnetic layer;
a non-magnetic pattern on the lower magnetic layer and at a side of the upper magnetic layer; and
a spacer layer between the lower magnetic layer and the upper magnetic layer and extending between the lower magnetic layer and the non-magnetic pattern, wherein the lower magnetic layer and the upper magnetic layer are antiferromagnetically coupled to each other by the spacer layer,
wherein the non-magnetic pattern has a first surface and a second surface, which are opposite to each other in a second direction perpendicular to the first direction, and the first direction and the second direction are parallel to a plane, and
wherein a junction surface between the non-magnetic pattern and the upper magnetic layer is inclined with respect to a reference surface perpendicular to the first surface and the second surface of the non-magnetic pattern.

2. The magnetic memory device of claim 1, wherein an angle between the reference surface and the junction surface between the non-magnetic pattern and the upper magnetic layer is greater than 30 degrees.

3. The magnetic memory device of claim 1, wherein the lower magnetic layer comprises lower magnetic domains and lower magnetic domain walls, which are alternately arranged in the first direction,
wherein the upper magnetic layer comprises upper magnetic domains and upper magnetic domain walls, which are alternately arranged in the first direction, and
wherein the upper magnetic domains vertically overlap with the lower magnetic domains in a third direction perpendicular to the first direction and the second direction, respectively.

4. The magnetic memory device of claim 3, wherein the non-magnetic pattern vertically overlaps with a corresponding lower magnetic domain of the lower magnetic domains in the third direction.

5. The magnetic memory device of claim 1, wherein the non-magnetic pattern includes oxygen.

6. The magnetic memory device of claim 1, wherein the non-magnetic pattern includes a metal oxide.

7. The magnetic memory device of claim 1, wherein the non-magnetic pattern includes a same magnetic element as a magnetic element in the upper magnetic layer and further includes oxygen.

8. The magnetic memory device of claim 1, further comprising:
a conductive line under the magnetic track and extending in the first direction,
wherein the lower magnetic layer is between the conductive line and the spacer layer.

9. The magnetic memory device of claim 8, wherein the conductive line is configured to generate spin-orbit torque by a current flowing therein.

10. The magnetic memory device of claim 8, wherein the conductive line includes a heavy metal element.

11. The magnetic memory device of claim 8, further comprising:
a read/write unit on the magnetic track,
wherein the upper magnetic layer is between the read/write unit and the spacer layer.

12. The magnetic memory device of claim 1, wherein the non-magnetic pattern vertically overlaps with a portion of the lower magnetic layer in a third direction perpendicular to the first direction and the second direction,
wherein the magnetic track has a ferromagnet-synthetic antiferromagnet (FM-SAF) lateral junction structure in which a ferromagnetic region and a synthetic antiferromagnetic region are joined to each other in the first direction,
wherein the synthetic antiferromagnetic region is a region in which the lower magnetic layer and the upper magnetic layer are antiferromagnetically coupled to each other by the spacer layer, and wherein the ferromagnetic region comprises: the non-magnetic pattern and the portion of the lower magnetic layer which vertically overlaps with the non-magnetic pattern.

13. A magnetic memory device comprising:
a magnetic track extending in a first direction,
wherein the magnetic track comprises:
a lower magnetic layer;
an upper magnetic layer on the lower magnetic layer;
a non-magnetic pattern on the lower magnetic layer and at a side of the upper magnetic layer; and
a spacer layer between the lower magnetic layer and the upper magnetic layer and extending between the lower magnetic layer and the non-magnetic pattern, wherein the lower magnetic layer and the upper magnetic layer are antiferromagnetically coupled to each other by the spacer layer, wherein the non-magnetic pattern has a first surface and a second surface which are opposite to each other in a second direction perpendicular to the first direction, and the first direction and the second direction are parallel to a plane, and wherein a length of the non-magnetic pattern in the first direction becomes progressively greater from the first surface toward the second surface.

14. The magnetic memory device of claim 13, wherein the non-magnetic pattern is in contact with a side surface of the upper magnetic layer.

15. The magnetic memory device of claim 14, wherein a junction surface between the non-magnetic pattern and the upper magnetic layer is inclined with respect to a reference surface perpendicular to the first surface and the second surface of the non-magnetic pattern.

16. The magnetic memory device of claim 15, wherein an angle between the reference surface and the junction surface between the non-magnetic pattern and the upper magnetic layer is greater than 30 degrees.

17. The magnetic memory device of claim 13, wherein the lower magnetic layer comprises lower magnetic domains and lower magnetic domain walls, which are alternately arranged in the first direction, wherein the upper magnetic layer comprises upper magnetic domains and upper magnetic domain walls, which are alternately arranged in the first direction, and wherein the upper magnetic domains vertically overlap with the lower magnetic domains in a third direction perpendicular to the first direction and the second direction, respectively.

18. The magnetic memory device of claim 17, wherein the non-magnetic pattern vertically overlaps with a corresponding lower magnetic domain of the lower magnetic domains in the third direction.

19. The magnetic memory device of claim 13, wherein the non-magnetic pattern includes a same magnetic element as a magnetic element in the upper magnetic layer and further includes oxygen.

20. The magnetic memory device of claim 13, further comprising:
a conductive line under the magnetic track and extending in the first direction,
wherein the conductive line is configured to generate spin-orbit torque by a current flowing therein.

* * * * *